United States Patent
Ashkenazi

(10) Patent No.: US 10,164,164 B2
(45) Date of Patent: Dec. 25, 2018

(54) FUTURISTIC HYBRID THERMOELECTRIC DEVICES AND DESIGNS AND METHODS OF USING SAME

(71) Applicant: Brian Isaac Ashkenazi, Los Angeles, CA (US)

(72) Inventor: Brian Isaac Ashkenazi, Los Angeles, CA (US)

( * ) Notice: Subject to any disclaimer, the term of this patent is extended or adjusted under 35 U.S.C. 154(b) by 176 days.

(21) Appl. No.: 14/120,411

(22) Filed: Jun. 13, 2013

(65) Prior Publication Data
US 2014/0366926 A1 Dec. 18, 2014

(51) Int. Cl.
*H01L 35/32* (2006.01)

(52) U.S. Cl.
CPC .................... *H01L 35/32* (2013.01)

(58) Field of Classification Search
CPC ...................................... H01L 35/32
See application file for complete search history.

(56) References Cited

U.S. PATENT DOCUMENTS

| | | | | |
|---|---|---|---|---|
| 4,640,977 A * | 2/1987 | Shakun | .................... | H01L 35/10 136/211 |
| 5,563,368 A * | 10/1996 | Yamaguchi | .............. | H01L 37/00 136/200 |
| 6,107,645 A * | 8/2000 | Hidaka | .................... | H01L 33/62 136/239 |
| 6,274,803 B1 * | 8/2001 | Yoshioka | ................ | H01L 35/34 136/201 |
| 2002/0092557 A1 * | 7/2002 | Ghoshal | .................. | H01L 35/34 136/201 |
| 2004/0155251 A1 * | 8/2004 | Abramov | ................ | H01L 23/38 257/81 |
| 2007/0144573 A1 * | 6/2007 | Mihara | ................... | C03C 17/23 136/205 |
| 2009/0025773 A1 * | 1/2009 | Stark | ....................... | H01L 35/32 136/212 |
| 2010/0252087 A1 * | 10/2010 | Deane | ..................... | H01L 35/32 136/240 |
| 2011/0036384 A1 * | 2/2011 | Culp | ..................... | H01L 35/325 136/201 |
| 2012/0139075 A1 * | 6/2012 | Shankar | .................. | H01L 23/38 257/467 |
| 2012/0145210 A1 * | 6/2012 | Ashkenazi | .............. | H01L 35/32 136/200 |
| 2013/0000688 A1 * | 1/2013 | Cho | ........................ | H01L 35/34 136/200 |
| 2013/0074898 A1 * | 3/2013 | Snyder | .................... | H01L 35/26 136/203 |

FOREIGN PATENT DOCUMENTS

JP 11284236 * 10/1999

* cited by examiner

*Primary Examiner* — Kevin R Kruer

(57) ABSTRACT

This patent incorporates several new hybrid thermoelectric element and thermoelectric device designs that utilize additional electronic materials to enhance the flow of charges in the thermoelectric elements without changing thermoelectric nature of the thermoelectric material used. The thermoelectric device efficiency is thereby increased and cost and size are lowered. Thermoelectric conversion devices using the new design criteria have demonstrated comparative higher performance than current commercially available standard design thermoelectric conversion devices.

1 Claim, 8 Drawing Sheets

FUTURISTIC HYBRID THERMOELECTRIC DEVICES AND DESIGNS AND METHODS OF USING SAME

CROSS-REFERENCE TO RELATED APPLICATION

This application claims priority of U.S. Provisional Patent Application No. 61/659,367, entitled "Futuristic Thermoelectric Devices and Designs and Methods of Using Same" filed Jun. 13, 2012.

BACKGROUND

Summary

Design of thermoelectric conversion devices, for power generation or cooling, of the present invention include (s) new hybrid element and device configurations and combinations that utilize, in addition to thermoelectric crystalline or amorphous materials, additional electrically and/or thermally conductive and/or insulator electronic materials to augment, enhance and boost the performance of thermoelectric elements and the thermoelectric devices thereof. New design criteria are also presented for multi-stage thermoelectric devices, layout and connection techniques, as well as for new heat transfer/electrical connectivity plates to lower device footprint and increase the output of the resulting thermoelectric device(s).

BRIEF DESCRIPTION OF THE DRAWINGS

The features, aspects, and advantages of the designs of this invention will become more thoroughly apparent from the following detailed description, appended claims, and accompanying drawings in which the proposed new designs for hybrid thermoelectric devices whereby the thermoelectric elements include the use of electrically and/or thermally conductive and/or insulator electronic materials (4) (20(24) (hereinafter referred to as "add-on electronic materials"), heat transfer/electrical connectivity plates, interconnections for use in thermoelectric devices are depicted.

Thermoelectric segment S-1 includes a single-piece L-shaped heat transfer connectivity plate S-1$_P$ having horizontal interconnection capability with thermal insulation attached at bottom to the heated plate S-4$_P$ and hybrid thermoelectric elements S-1$_{TE}$ attached to one side of the vertical part of the plate S-1$_P$.

Thermoelectric segment S-2 includes a single-piece L-shaped heat transfer connectivity plate S-2$_P$ with thermal insulation attached at top to the cooling plate S-1$_P$ and hybrid thermoelectric elements S-2$_{TE}$ attached to one side of the vertical part of the plate S-2$_P$.

Thermoelectric segment S-3 includes a single-piece L-shaped heat transfer connectivity plate S-3$_P$ with thermal insulation attached at bottom to the heated plate S-2$_P$ and no hybrid thermoelectric elements attached to the vertical part of the plate S-3$_P$.

Thermoelectric segment S-4 shows one of two (2) pieces of an L-shaped heat transfer connectivity plate S-4$_P$.

Figure 20:
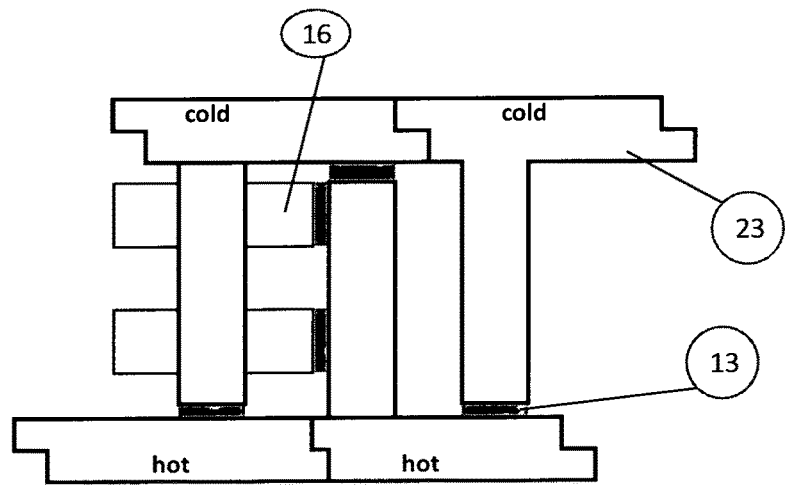

FIG. 20 illustrates a thermoelectric segment with thermoelectric elements attached to both faces of, say, the hot (or cold) heat transfer/electrical connectivity plate and no thermoelectric elements attached to the cold (or hot) heat transfer/electrical plate. Four (4) thermoelectric segments horizontally interconnected to form a multistage thermoelectric device with heat applied to device at one end (depicted at bottom) and cooling applied at other end (depicted at top), as follows:

Thermoelectric segment S-5 includes a two (2) piece L-shaped heat transfer connectivity plate S-5$_P$ with hybrid thermoelectric elements S-5$_{TE}$ attached on both sides of the vertical part of the plate.

Thermoelectric segment S-6 includes a two (2) piece L-shaped heat transfer connectivity plate S-6$_P$ with no hybrid thermoelectric elements attached to the vertical part of the plate.

Thermoelectric segment S-7 includes a single-piece L-shaped heat transfer connectivity plate S-7$_P$ with no hybrid thermoelectric elements attached to the plate.

Thermoelectric segment S-8 shows one of two (2) pieces of a heat transfer connectivity plate S-4$_P$.

Heat is applied to the bottom of the multistage thermoelectric device, i.e., thru heat transfer connectivity plates S-6$_P$ and S-8$_P$, and heat is transferred thru hybrid thermoelectric elements S-5$_{TE1}$ and S-5$_{TE2}$ respectively and directed to the top of heat transfer cooling plate S-5$_P$.

Figure 21:
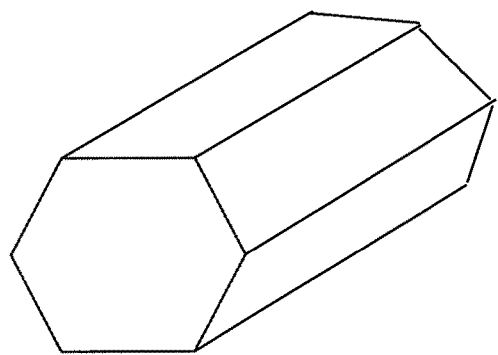

FIG. 21 depicts a multi-sided (hexagonal) post to which thermoelectric segments can be attached for the multistage thermoelectric device to produce denser population of thermoelectric elements in the multi-stage thermoelectric device.

Figure 22:
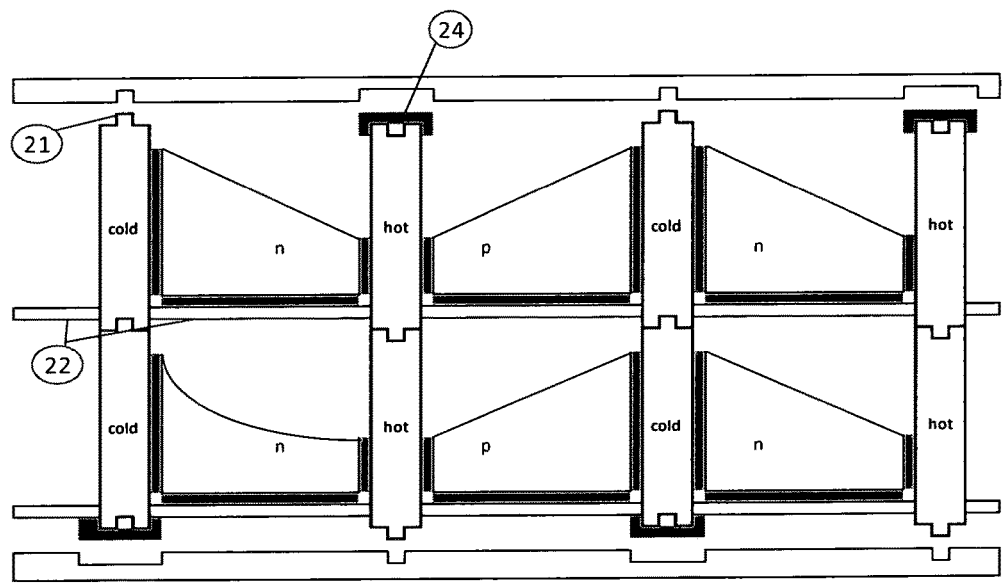

FIG. 22 depicts eight (8) thermoelectric segments vertically interconnected to respective external hot (depicted at bottom) and cold (depicted at top) plates to form a multi-stage thermoelectric device, as follows:

Thermoelectric segment S-9 includes a heat transfer connectivity plate S-9$_P$ having vertical interconnection capability (vertically attached at bottom to S-16$_P$ and attached at top to the external cold plate) and includes a horizontal platform for the thermoelectric devices to sit on and hybrid thermoelectric elements S-9$_{TE}$ attached to one side of the vertical plate.

Thermoelectric segment S-10 includes a heat transfer connectivity plate S-10$_P$ having vertical interconnection capability (vertically attached at bottom to S-15$_P$ and with thermal insulation attached at top to the external cold plate) and no hybrid thermoelectric elements attached to the vertical plate.

Thermoelectric segment S-11 includes a heat transfer connectivity plate S-11$_P$ having vertical interconnection capability (vertically attached at bottom to S-14$_P$ and attached at top to the external cold plate) and includes a platform on both sides for the thermoelectric devices to sit on with hybrid thermoelectric elements S-11$_{TE1}$ attached to one side of the vertical plate and hybrid thermoelectric elements S-11$_{TE2}$ attached to the other side of the vertical plate.

Thermoelectric segment S-12 includes a heat transfer connectivity plate S-12$_P$ having vertical interconnection capability (vertically attached at bottom to S-13$_P$ and attached at top with thermal insulation to the external cold plate) and no hybrid thermoelectric elements attached to the vertical plate.

Thermoelectric segment S-13 includes a heat transfer connectivity plate S-13$_P$ having vertical interconnection capability (vertically attached at top to S-12$_P$ and attached at bottom to the external heated plate) and no hybrid thermoelectric elements attached to the vertical plate.

Thermoelectric segment S-14 includes a heat transfer connectivity plate S-14$_P$ having vertical interconnection capability (vertically attached at top to S-11$_P$ and attached at bottom with thermal insulation to the external heated plate) and includes a platform on both sides for the thermoelectric devices to sit on) with hybrid thermoelectric elements S-14$_{TE1}$ attached to one side of the vertical plate and hybrid thermoelectric elements S-14$_{TE2}$ attached to the other side of the vertical plate.

Thermoelectric segment S-15 includes a heat transfer connectivity plate S-15$_P$ having vertical interconnection capability (vertically attached at top to S-10$_P$ and attached at bottom to the external heated plate) and no hybrid thermoelectric elements attached to the vertical plate.

Thermoelectric segment S-16 includes a heat transfer connectivity plate S-16$_P$ having vertical interconnection capability (vertically attached at top to S-9$_P$ and attached at bottom with thermal insulation to the external heated plate) and includes a horizontal platform for the thermoelectric devices to sit on and hybrid thermoelectric elements S-9$_{TE}$ attached to one side of the vertical plate.

Heat is applied to the bottom external heating plate which is transferred thru the vertical plates of segments S-15 and S-10 via heat transfer connectivity plates S-15$_P$ and S-10$_P$ thru hybrid thermoelectric elements S-16$_{TE}$, S-14$_{TE2}$, S-9$_{TE}$ and S-11$_{TE1}$ respectively and directed to the heat transfer cooling plates S-16$_P$, S-9$_P$, S-14$_P$ and S-12$_P$ respectively to the top external cooling plate.

Heat is also transferred from the bottom external heating plate thru the vertical plates of segments S-13 and S-12 thru heat transfer connectivity plates S-13$_P$ and S-12$_P$ and thru hybrid thermoelectric elements S-13$_{TE1}$ and S-11$_{TE2}$, respectively and directed to the heat transfer cooling plates S-14$_P$ and S-11$_P$ respectively to the top external cooling plate.

DETAILED DESCRIPTION

The conversion efficiency of heat to useful energy is an on-going challenge for the energy industry. Current commercially available thermoelectric conversion devices, for cooling and power generation, are fabricated from regular shaped (rectangular, cube, cylindrical, etc.) thermoelectric elements and produce relatively low efficiency heat conversion when compared to other renewable energy conversion technologies such as photovoltaic and wind power.

Thermoelectric conversion devices have made incremental gains in device efficiency over the past decade mainly due to continued development of many new expensive thermoelectric materials with higher ZT (a thermoelectric figure of merit). Utilizing the new expensive materials no doubt yields slightly better efficiency for the thermoelectric devices but cost makes them prohibitive for commercial use, and they are not yet competitively efficient to other renewable energy conversion technologies, such as photovoltaic.

Other types of thermoelectric conversion devices are also fabricated using other techniques including vapor deposition, thin-film, design/lay out on an electronic material wafer, segmented design, nanomaterials, nanotube devices, etc., that also incrementally help in surmounting the thermoelectric efficiency barrier; however, the fabrication costs to produce them still remain prohibitively high.

The basic premise of the workings of a thermoelectric device is that the temperature gradient/difference from hot side of a thermoelectric element pair to the cold side of element pair determines the voltage across the device and hence the flow of charges and efficiency rating. Therefore, tremendous effort continues to be also expended in the development of heat sink/cooling assemblies that rapidly remove the heat from the cold side of the element as well as new thermoelectric materials that provide more favorable thermoelectric output properties.

Figure 1:
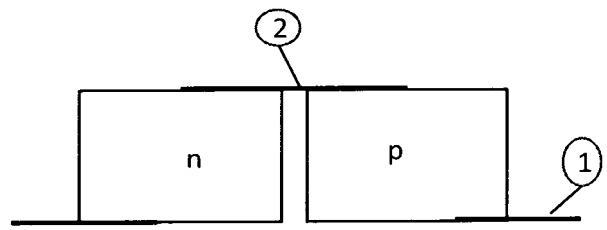
FIG. 1 is a side view of n-type/p-type thermoelectric elements that illustrates the layout of thermoelectric elements in current typical commercially available thermoelectric conversion devices.

Commercially available conventional thermoelectric conversion devices require ann-type thermoelectric element as well asap-type thermoelectric element, both fabricated from standard relatively inexpensive bulk materials, which are interconnected. FIG. 1 provides the general layout of a typical commercially available thermoelectric device. N-type and p-type Bismuth Telluride [(Bi Sb)2Te3] thermoelectric elements, mostly rectangular in shape, i.e., the cross sectional area is constant along the vertical axis or path of heat flow, are sandwiched between two high thermal conductivity alumina substrates. With alternating bottom interconnects (1) and top interconnects (2), then-type and p-type elements are connected sequentially in series. For the drawings of this patent, the heat flow is from the bottom to the top, making all thermoelectric elements thermally in parallel. In cooling mode, an externally applied current forces the heat to flow from the bottom to the top. In power generation mode, heat flowing from the bottom to the top drives a current through an external load.

The basic premise of this patent is to utilize standard commercially available, inexpensive thermoelectric crystalline or amorphous material element(s), regular or irregular shaped (6), and improve the performance of same using new and unique design criteria combined with other add-on electronic materials to achieve power outputs very similar to the thermoelectric devices made from expensive, high-ZT materials.

The flow of charges in the thermoelectric materials is currently impeded by the limitations of the materials or the ZT factor of the specific thermoelectric material. Highly expensive R & D is ongoing to find a thermoelectric material with a high(er) ZT factor. However, one common factor is always found lacking, i.e., creative design to inexpensively solve and overcome this important issue.

This patent incorporates new designs of hybrid thermoelectric elements using add-on electronic material(s), new layout and connection techniques as well as new heat transfer/electrical connectivity plates to increase the output of the resulting thermoelectric device(s). The combinations of the aforementioned with new interconnections cause a turbocharging effect on the thermoelectric element(s) by expediting and improving the flow of charges through each thermoelectric element without compromising the thermoelectric nature of the thermoelectric material. This enhances circuit performance of the thermoelectric element pairs and ultimately produces higher output efficiency of the thermoelectric conversion device.

The add-on electronic material(s) are comprised of metal, non-metal, semiconductor, superconductor, ceramic, plastic, resin, adhesive or similar conductor and/or insulator material(s) and/or combination(s) of the aforementioned material(s)

Figure 2:
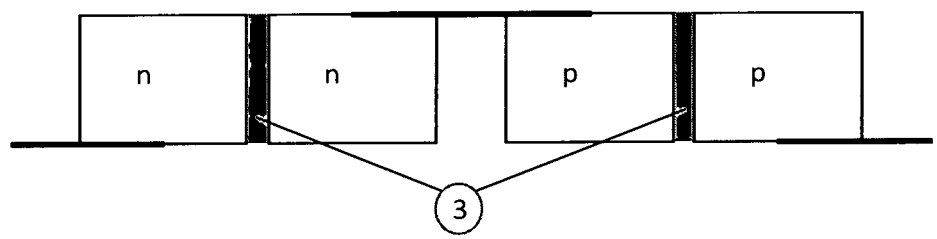
FIG. 2 illustrates a basic thermoelectric pair of elements with add-on electronic material(s) attached between two thermoelectric pieces along the flow of charges of each thermoelectric element.
Figure 3:
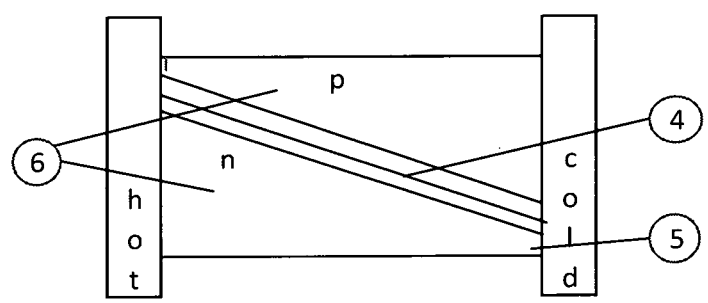
FIG. 3 illustrates a thermoelectric device with both elements having a basic low-to-high area concept with inverted thermoelectric elements to improve performance and reduce footprint of the thermoelectric device. Add-on electronic material(s) are not depicted but are easily incorporated.
Figure 4:
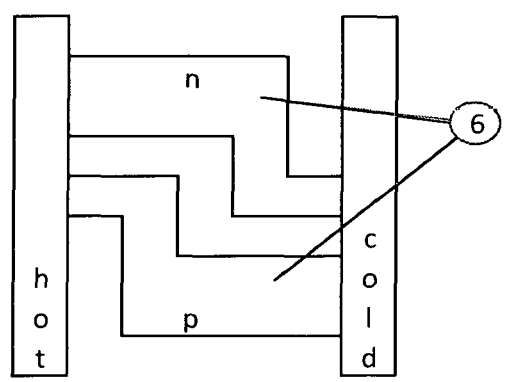
FIG. 4 illustrates a thermoelectric device with both elements having a basic low-to-high area concept with inverted irregular shaped thermoelectric elements to improve performance and reduce footprint of the thermoelectric device.
Figure 5:
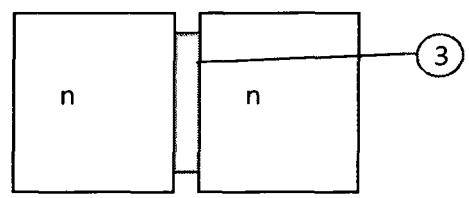
FIG. 5 illustrates a basic thermoelectric pair of elements with add-on electronic material(s) attached along the partial common face between two thermoelectric pieces along the flow of charges of each thermoelectric element.
Figure 6:
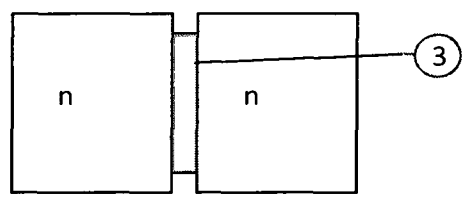
FIG. 6 illustrates a basic thermoelectric pair of elements with add-on electronic material(s) attached along the entire common face between two thermoelectric pieces completely along the flow of charges of each thermoelectric element.
Figure 7:
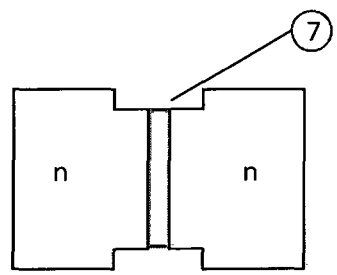
FIG. 7 illustrates a pair of thermoelectric pieces of a thermoelectric element whereby the add-electronic material (s) extend out from their common face along the flow of charges to make thermal and/or electrical contact with the heat transfer/electrical connectivity plate(s).

During testing of various new designs of thermoelectric elements, it was found that by connecting/attaching a conductive strip between two half-sized thermoelectric pieces, along the direction of the flow of charges (FIG. 2), thermoelectric pairs of this design produced approximately 2× the output power when compared to a thermoelectric pair comprising standard rectangular full-size thermoelectric elements. This was repeated several times with very similar results. It was thereby realized that the thermoelectric materials can be made to perform better by inexpensively introducing localized and simple specially designed add-on electronic materials to increase the flow of charges within the thermoelectric element(s).

Several criteria are presented below for the hybrid thermoelectric elements with the add-on electronic material (s); using one or more of these criteria boosts the flow of charges in the thermoelectric materials/elements:

External Attachment: add-on electronic material (s) is/are attached between (3) or on the side(s) (8) (16) similar (n-type or p-type) thermoelectric crystalline or amorphous pieces along the flow of charges on their common face to form a thermoelectric element (FIGS. 5-14).

Figure 9:
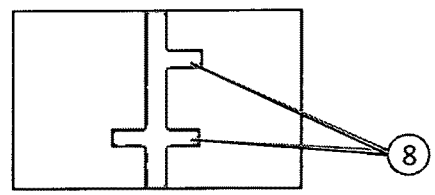
FIG. 9 illustrates add-on electronic material(s) with attached wing(s) embedded in the thermoelectric material of a thermoelectric element
Figure 10:
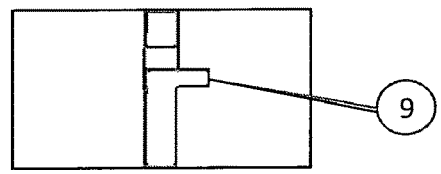
FIG. 10 illustrates add-on material(s) with cut out wing(s) embedded in the thermoelectric material of a thermoelectric element.
Figure 11:
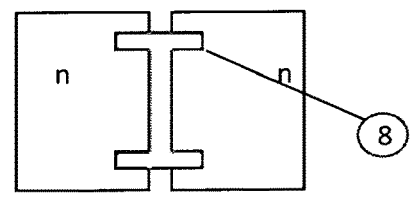
FIG. 11 illustrates two thermoelectric pieces in a thermoelectric element with add-on electronic material(s) including wings attached to their partial common face along the flow of charges of the thermoelectric pieces.

Internal Placement: the add-on electronic material(s) may be placed internal to a thermoelectric piece along the flow of charges using a extrusion, pultrusion or molding process (FIG. 9). A good example is electrical wire being extruded with the thermoelectric material.

Surface Preparation: when applied to the add-on electronic material(s) will assist to produce better electrical or insulator bonding at their respective contact surface(s) with the thermoelectric crystalline or amorphous piece(s), internally and/or externally.

Figure 8:
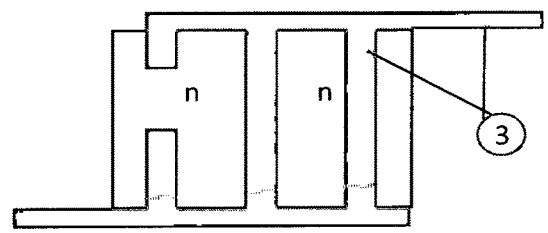
FIG. 8 illustrates add-on electronic material(s) embedded along the flow of charges in a thermoelectric element and connecting with adjacent element(s) as well as the heat transfer/connectivity plates).

Staggered: the add-on material(s) attached, or internal, to the thermoelectric pieces is/are staggered or in a discontinuous pattern (FIG. 8).

Connectivity: the add-on electronic material(s) is/are extended from the attachment on the thermoelectric piece to make thermal connection with the heat transfer/electrical connectivity plates and/or electrical connection. with adjacent similar or dissimilar thermoelectric pieces/elements (FIG. 12).

In addition, use of the add-on materials allows for creative new connection techniques such as incorporating integral snap-on, snap-fit, slide on, spring like and/or adhesive bonded design (5) to connect the thermoelectric element to adjacent thermoelectric element(s) or to heat transfer/electrical connectivity plate(s) of the thermoelectric device.

Figure 12A:
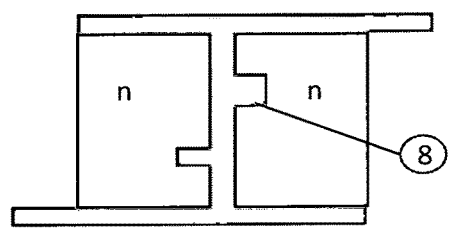
FIG. 12a illustrates two thermoelectric pieces in a thermoelectric element with add-electronic material(s), including wings, partially attached along their entire common face and the add-on electronic material(s) extend from the thermoelectric pieces to make thermal contact with the heat transfer/electrical connectivity plate(s) as well as electrical contact with adjacent dissimilar thermoelectric elements.
Figure 12B:
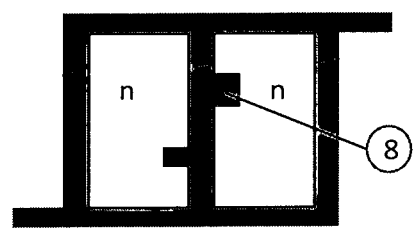
FIG. 12b illustrates two thermoelectric pieces in a thermoelectric element fully encased with add-electronic material(s), including wings, partially attached along their entire common face and the add-on electronic material(s) extend from the thermoelectric pieces to make thermal contact with the heat transfer/electrical connectivity plate(s) as well as electrical contact with adjacent dissimilar thermoelectric elements.

External Encasement: the add-on electronic materials totally encase the thermoelectric piece/element (FIG. 12b).

Penetrations: the add-on electronic material(s) are attached to the thermoelectric piece(s) and include have protrusion(s) or wing(s) (8) and/or cutout(s) (9) that penetrate(s) the thermoelectric piece(s)/element(s) for better electrical conductivity (FIG. 9). A good example of this is to have several U-shaped staple-like items made from add-on electronic material(s) randomly attached and penetrate the thermoelectric piece(s)/element(s).

Spiral Encasement: the add-on material(s) is/are spirally wound around, or internal to, thermoelectric piece(s)/element(s).

Electrical windings: electrical wire is wrapped around, or internal to, one or more thermoelectric piece(s) or thermoelectric element(s).

Figure 16:
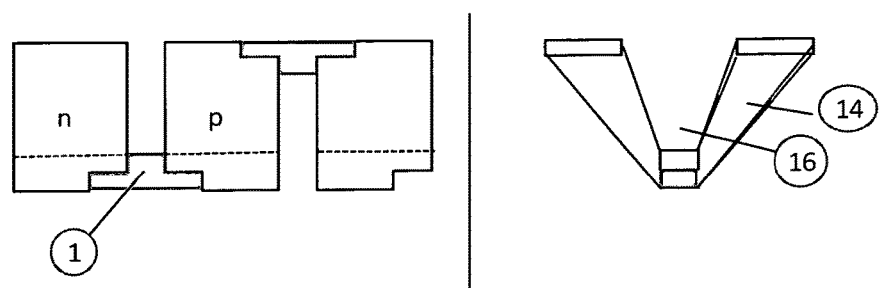
FIG. 16 illustrates an open-top thermoelectric element (14) design to enhance thermoelectric device performance in airflow environments as well as allow additional electrical wire winding in the thermoelectric device.
Figure 17:
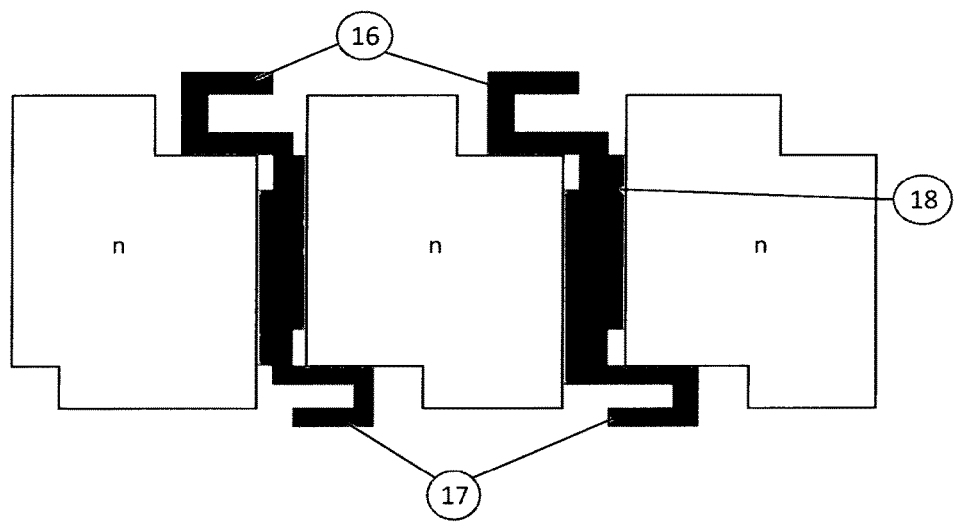
FIG. 17 illustrates a thermoelectric device whereby one of the thermoelectric element(s) is/are, say, of only n-type (or p-type) thermoelectric crystalline material with cutouts at top and bottom as depicted, and the second thermoelectric element(s) comprise(s) of add-on electronic material(s) with corresponding p-type (or n-type) thermoelectric conductive material that connects to the top and bottom of the respective adjacent first thermoelectric elements; the thermoelectric conductive material of the add-on electronic material is also designed to make thermal contact(s) by a spring-type design with the heat transfer/electrical conductivity plate(s).

Open-top Elements: present a new avenue for winding electrical wire around the thermoelectric elements. The wire will assist with rapid heat removal from the thermoelectric elements as well as augment electrical output when subjected to magnetic field(s) (FIG. 16). This design is also useful where the thermoelectric device(s) are attached to surface(s) in motion and the rushing air provides excellent cooling of the thermoelectric devices.

Figure 13:
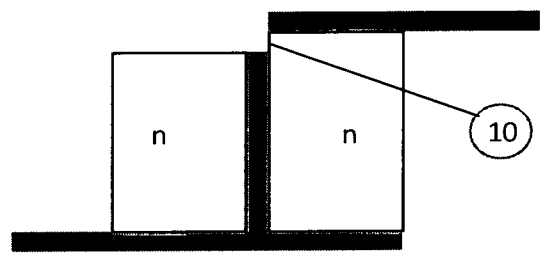
FIG. 13 illustrates a pair of thermoelectric pieces of differing height in a thermoelectric element with add-electronic material(s) partially attached on their common face along the flow of charges and the add-on electronic material (s) extend out from the bottom and top of the thermoelectric pieces (10) to make thermal contact with the heat transfer/electrical connectivity plate(s) as well as electrical contact with adjacent dissimilar thermoelectric elements.
Figure 14:
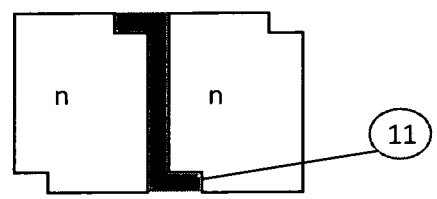
FIG. 14 illustrates two thermoelectric pieces in a thermoelectric element with add-on electronic material(s) attached along the flow of charges at the common face of the thermoelectric pieces as well as wings (11) at the top and bottom of the thermoelectric pieces

Height Difference: one or more of the multiple thermoelectric pieces in each thermoelectric element having differing heights (FIG. 13).

Connections: one or more of the multiple pieces in the thermoelectric element is/are thermally and/or electrically attached/connected by the add-on electronic material(s) to the hot and/or cold heat transfer/electrical connectivity plate(s) and/or to adjacent similar or dissimilar thermoelectric piece(s) (FIG. 12a).

Figure 15:
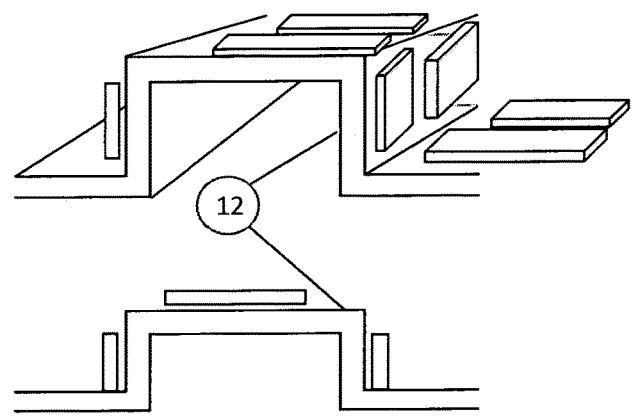
FIG. 15 illustrates a channel-shaped heat transfer/electrical connectivity plate (12) with multiple thermoelectric elements attached to the plate for thermoelectric device footprint reduction.

Plate Topography: allows for more creative approaches to the differing heights of thermoelectric pieces/elements with modified height as well as reducing device footprint (FIG. 15).

Plate Perforations: addition of holes in the heat transfer/electrical connectivity plate allow the add-on electronic material(s) to penetrate the plate and make direct contact with the heat source to provide better heat transfer to the thermoelectric element.

Thermal Conduction: of the add-on material(s) (7) also plays a tremendous role in aiding the rapid movement of charges through the thermoelectric element(s) (17).

Electrical Insulation: used to hold/separate thermoelectric pieces apart (13).

Figure 18:
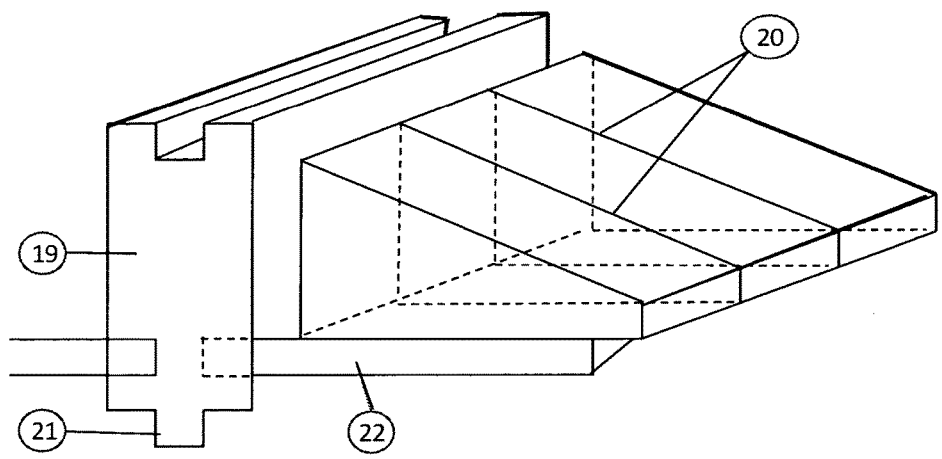
FIG. 18 illustrates a thermoelectric segment S-0 that has a multi-piece heat transfer connectivity plate S-0$_P$ with vertical connection capability (for interconnection to other similar plate(s)) and with thermoelectric elements S-0$_{TE}$ attached to one side of the vertical plate S-0$_P$.
Figure 19:
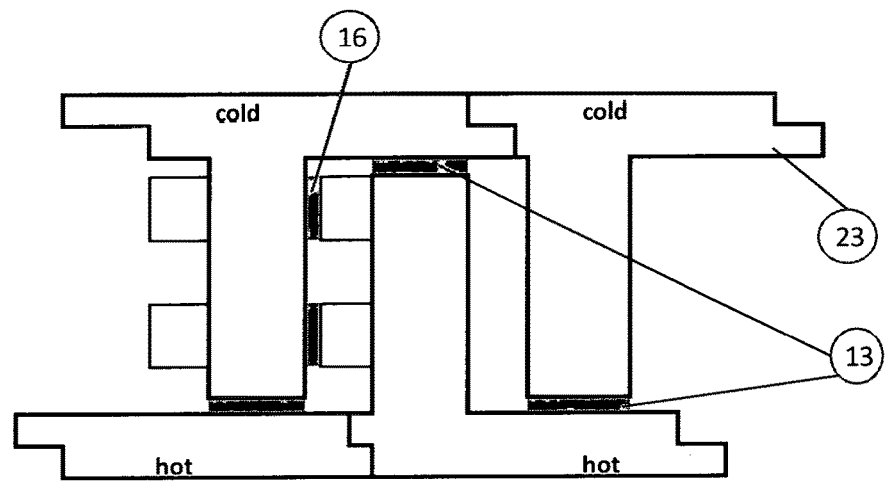
FIG. 19 illustrates four (4) thermoelectric segments horizontally interconnected to form a multistage thermoelectric device with heat applied to device at one end (depicted at bottom) and cooling applied at other end (depicted at top) as follows.

Thermoelectric Segment (18)(FIGS. 18, 19 and 20): comprises a single heat transfer connectivity plate, comprising one or more pieces, with one side of a thermoelectric element attached to one or both side(s) of the heat transfer connectivity plate and heat is transferred to the thermoelectric elements as it flows transverse to, i.e., along the length of, the heat transfer connectivity plate.

Building Block: for construction of a thermoelectric device; posts (19) include specialty attachments (21).

Heat Transfer/Electrical Connectivity Plate: specially designed (23) to include several, or no, thermoelectric elements attached to one or both sides of the face of plate. Optional bottom plates may support the thermoelectric elements (22). Multiple plate designs change the flow direction of the heat in the thermoelectric device (FIG. 22).

Thermal Insulation: required between the hot and cold plates (18).

Connections: The heat transfer/electrical connectivity plate design incorporates integral snap-on, snapfit, slide on, spring like and/or adhesive bonded capability on the face plate(s) to connect the thermoelectric element to adjacent thermoelectric element(s) and or to the heat transfer/electrical connectivity plate(s) of the thermoelectric device.

Ease of Manufacturability-multiple off-the shelf thermoelectric segments are readily are readily fitted together for in-time manufacture of any size/power thermoelectric device.

New Multistage Devices (FIGS. 18, 19, 20 and 22):

Multiple thermoelectric segments are connected together to each other and, where required, with additional heat transfer connectivity plate(s) that do not have thermoelectric element(s) attached such that each thermoelectric element is connected to a hot and cold heat transfer connectivity plate to form the multistage device.

Footprint: is drastically reduced in comparison to current equivalent devices with similar power output.

Multiple Plate Design: Posts are interconnected and attach to a flat hot, or cold, plate.

Connections: as noted above for thermoelectric segments

Other Uses: attached to any surface, stationary or mobile.

Magnetic Fields:

Specially designed thermoelectric elements and/or thermoelectric segments include the conductor part of the add-on electronic material(s) positioned and laid out in a specific layout, pattern and/or orientation such that the charges in the add-on electronic materials are positively influenced by the magnetic fields. Magnets are then strategically placed in, on or external to the thermoelectric device(s). The magnetic field(s) then further excite the charges in the conductor materials of the add-on electronic material(s) to further enhance flow of charges in the thermoelectric pieces and/or thermoelectric elements.

In addition, these specially designed thermoelectric elements of the heat conversion devices could be placed on a stationary or mobile surface to obtain maximum effect from the magnetic fields. One such example is to position these specially designed thermoelectric elements and thermoelectric segments on a multi-sided (hexagonal or similar) shaped drum with rotational bearings affixed at both ends of the drum, and apply heat to one side of the thermoelectric elements to create current to continuously flow in one direction through the heat conversion devices and also apply continuous magnetic fields to the assembly to create forces on this current and cause rotation of the drum.

Comparative Testing Performed on New Thermoelectric Device Designs: Testing was performed on pairs of double half-sized thermoelectric elements with add-on electronic material(s) attached between the half-pieces and compared with pairs of pairs of full-sized thermoelectric elements.

Per the design criteria discussed above the following work was performed:

each pair of thermoelectric elements was sandwiched between alumina plates and electrical connections were made between the thermoelectric elements specific to each thermoelectric element pair/device each thermoelectric device was placed on a test bench heat was applied to the bottom alumina plate (1) of the thermoelectric device heat removal/cooling was applied to the top alumina plate (2) of the thermoelectric device extreme care was taken at all times to isolate the heat application strictly to the bottom plate and the same for the cooling at the top plate.

For each test performed on the devices fabricated, the following test criteria were intentionally and strictly kept constant:

1) Electrical connections in device and circuitry
2) Temperature of heat input (1)
3) Heat removal/cooling (2)
4) Test circuit layout including resistor, wires, ammeter and voltmeter
5) Alumina plates-size, thickness, material type
6) N-type material-initial size and from same material batch; half-sized too
7) P-type material-initial size and from same material batch; half-sized too
8) Time of test heat up and measurement of results Testing: A resistive-type heater was applied to one side of one test device at a time and heat removal/cooling applied to the other side of the device. The voltage readings and current were recorded at 5-10 minute intervals Test results for each of the three batches differed slightly; however, it was found that for each batch the results were comparably the same, i.e., the new double half-size thermoelectric element pair designs with add-on electronic material(s) produced results that were 75-90% higher than those of the standard full-sized thermoelectric element pair designs.

It is anticipated that the proposed designs of this patent will be utilized with all thermoelectric materials and fluids, add-on electronic materials, standard or irregular thermoelectric element shapes and/or designs, element pairs, individual and multiple heat transfer/electrical connectivity plate designs, shapes and connections, thermoelectric device designs and shapes, thermoelectric segment shapes and layouts, multi-stage thermoelectric designs, shapes and devices, magnetic enhancement/effect of/on the add-on electronic material(s) included with the thermoelectric element(s), fabrication processes, and methods of manufacture to produce the highest efficiency thermoelectric elements, thermoelectric element pairs, thermoelectric segments, thermoelectric conversion devices, and multi-stage thermoelectric devices and systems for economical, high conversion efficiency and emission free power generation and cooling.

Many widely different examples of this invention may be made without departing from the spirit and scope thereof, and it is to be understood that the invention is not limited to the specific examples thereof except as defined in the appended claims.

The invention claimed is:

1. A heat conversion device comprising a hybrid thermoelectric element which comprises a thermoelectric material and a material that is bonded or attached in a continuous or discontinuous pattern to said thermoelectric material and which makes thermal and electrical contact along a face other than the heat input or heat removal face of said thermoelectric material of said hybrid thermoelectric element, wherein said thermoelectric material of said hybrid thermoelectric element has at least one recessed corner wherein a second thermoelectric material or hybrid thermoelectric element is capable of being connected;

said heat conversion device is further attached to a drum with rotational capability with heat applied to one side of said hybrid thermoelectric element of said heat conversion device to create a continuous flow of charges in a singular direction in said heat conversion device and the heat conversion device is subjected to a continuous magnetic field to cause rotation of the drum.

\* \* \* \* \*